(12) United States Patent
Cai et al.

(10) Patent No.: US 9,424,179 B2
(45) Date of Patent: Aug. 23, 2016

(54) SYSTEMS AND METHODS FOR LATENCY BASED DATA RECYCLING IN A SOLID STATE MEMORY SYSTEM

(71) Applicant: SEAGATE TECHNOLOGY LLC, Cupertino, CA (US)

(72) Inventors: Yu Cai, San Jose, CA (US); Yunxiang Wu, Cupertino, CA (US); Ning Chen, San Jose, CA (US); Erich F. Haratsch, San Jose, CA (US); Zhengang Chen, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 137 days.

(21) Appl. No.: 14/072,530

(22) Filed: Nov. 5, 2013

(65) Prior Publication Data
US 2015/0113205 A1 Apr. 23, 2015

Related U.S. Application Data

(60) Provisional application No. 61/892,429, filed on Oct. 17, 2013.

(51) Int. Cl.
*G06F 12/02* (2006.01)
*G06F 11/10* (2006.01)
*H03M 13/11* (2006.01)
*H03M 13/00* (2006.01)

(52) U.S. Cl.
CPC ........ *G06F 12/0246* (2013.01); *G06F 11/1012* (2013.01); *H03M 13/1102* (2013.01); *H03M 13/1111* (2013.01); *H03M 13/6505* (2013.01); *G06F 2212/7205* (2013.01); *H03M 13/1105* (2013.01); *H03M 13/1128* (2013.01)

(58) Field of Classification Search
None
See application file for complete search history.

(56) References Cited

U.S. PATENT DOCUMENTS

| | | | |
|---|---|---|---|
| 5,892,896 A | 4/1999 | Shingo | |
| 6,516,425 B1 | 2/2003 | Belhadj et al. | |
| 6,651,032 B2 | 11/2003 | Peterson et al. | |
| 7,120,051 B2 * | 10/2006 | Gorobets et al. | ......... 365/185.02 |
| 7,127,549 B2 | 10/2006 | Sinclair | |
| 7,237,074 B2 * | 6/2007 | Guterman et al. | ............ 711/156 |
| 7,254,692 B1 | 8/2007 | Teoh et al. | |

(Continued)

FOREIGN PATENT DOCUMENTS

KR 10/2009-0013394 2/2009
WO 2012042444 A1 4/2012

OTHER PUBLICATIONS

U.S. Appl. No. 14/072,530, filed Nov. 5, 2013, Cai.

(Continued)

*Primary Examiner* — Jared Rutz
*Assistant Examiner* — William E Baughman
(74) *Attorney, Agent, or Firm* — Holland & Hart LLP

(57) ABSTRACT

Systems and method relating generally to solid state memory, and more particularly to systems and methods for recycling data in a solid state memory. The systems and methods include receiving a data set maintained in a memory device, applying at least one iteration of a data decoding algorithm to the data set by a data decoder circuit to yield a decoded output, counting the number of iterations of the data decoding algorithm applied to the data set to yield an iteration count, and recycling the data set to the memory device. The recycling is triggered based at least in part on the iteration count.

13 Claims, 3 Drawing Sheets

(56) References Cited

U.S. PATENT DOCUMENTS

| | | |
|---|---|---|
| 7,310,699 B2 | 12/2007 | Sinclair |
| 7,523,013 B2 | 4/2009 | Gorobets et al. |
| 7,596,656 B2 | 9/2009 | Elhamias |
| 7,721,146 B2 | 5/2010 | Polisetti et al. |
| 7,778,077 B2 | 8/2010 | Gorobets et al. |
| 7,793,201 B1 | 9/2010 | Ulriksson |
| 8,010,738 B1 | 8/2011 | Chilton et al. |
| 8,151,137 B2 | 4/2012 | McKean |
| 8,174,912 B2 | 5/2012 | Warren |
| 8,176,367 B2 | 5/2012 | Dreifus |
| 8,289,768 B2 | 10/2012 | Warren et al. |
| 8,381,077 B2 | 2/2013 | Warren |
| 8,458,416 B2 | 6/2013 | Warren et al. |
| 8,499,220 B2 | 7/2013 | Warren |
| 8,560,765 B2 | 10/2013 | Warren |
| 2002/0091965 A1 | 7/2002 | Moshayedi |
| 2005/0044459 A1 | 2/2005 | Scheuerlein et al. |
| 2005/0172067 A1 | 8/2005 | Sinclair |
| 2005/0204187 A1 | 9/2005 | Lee et al. |
| 2005/0209804 A1 | 9/2005 | Basso et al. |
| 2006/0245248 A1 | 11/2006 | Hu |
| 2007/0028040 A1 | 2/2007 | Sinclair |
| 2007/0070764 A1* | 3/2007 | Miyamoto et al. ............ 365/222 |
| 2007/0266200 A1 | 11/2007 | Gorobets et al. |
| 2008/0010557 A1 | 1/2008 | Kume |
| 2008/0046779 A1 | 2/2008 | Merchant et al. |
| 2008/0086275 A1 | 4/2008 | Astigarraga et al. |
| 2008/0162079 A1 | 7/2008 | Astigarraga et al. |
| 2008/0162791 A1* | 7/2008 | Eldredge et al. ............. 711/103 |
| 2008/0307270 A1 | 12/2008 | Li |
| 2009/0063895 A1 | 3/2009 | Smith |
| 2009/0067303 A1 | 3/2009 | Poo et al. |
| 2009/0147698 A1 | 6/2009 | Potvin |
| 2009/0172280 A1 | 7/2009 | Trika et al. |
| 2009/0204853 A1 | 8/2009 | Diggs et al. |
| 2009/0282301 A1 | 11/2009 | Flynn et al. |
| 2009/0323412 A1* | 12/2009 | Mokhlesi et al. ........ 365/185.02 |
| 2010/0121609 A1 | 5/2010 | Gorinevsky |
| 2010/0122148 A1 | 5/2010 | Flynn et al. |
| 2010/0174845 A1 | 7/2010 | Gorobets et al. |
| 2010/0306577 A1 | 12/2010 | Dreifus et al. |
| 2010/0306580 A1 | 12/2010 | McKean et al. |
| 2010/0332943 A1* | 12/2010 | D'Abreu et al. .............. 714/763 |
| 2011/0058415 A1 | 3/2011 | Warren |
| 2011/0060862 A1 | 3/2011 | Warren |
| 2011/0060865 A1 | 3/2011 | Warren et al. |
| 2012/0102261 A1 | 4/2012 | Burger et al. |
| 2012/0110376 A1 | 5/2012 | Dreifus et al. |
| 2012/0284587 A1* | 11/2012 | Yu et al. ....................... 714/773 |
| 2013/0191700 A1 | 7/2013 | Griffin et al. |

OTHER PUBLICATIONS

U.S. Appl. No. 14/072,571, filed Nov. 5, 2013, Wu.

U.S. Appl. No. 14/047,423, filed Oct. 7, 2013, Haitao Xia, Unpublished.

U.S. Appl. No. 13/912,063, filed Jun. 6, 2013, Fan Zhang, Unpublished.

European Search Report for Application No. EP 14189389, mailed Jun. 29, 2015.

\* cited by examiner

SYSTEMS AND METHODS FOR LATENCY BASED DATA RECYCLING IN A SOLID STATE MEMORY SYSTEM

CROSS REFERENCE TO RELATED APPLICATIONS

The present application claims priority to (is a non-provisional of) U.S. Pat. App. No. 61/892,249 entitled "Systems and Methods for Latency Based Data Recycling in a Solid State Memory System", and filed Oct. 17, 2013 by Cai et al. The entirety of the aforementioned provisional patent application is incorporated herein by reference for all purposes.

FIELD OF THE INVENTION

Systems and method relating generally to solid state memory, and more particularly to systems and methods for recycling data in a solid state memory.

BACKGROUND

Data in a solid state storage device decays over time requiring more error correction capability over time. To correct additional errors, enhanced error correction circuitry may be employed. However, such enhanced error correction circuitry increases access latency.

Hence, for at least the aforementioned reasons, there exists a need in the art for advanced systems and methods for maintaining data in a solid state storage device.

SUMMARY

Systems and method relating generally to solid state memory, and more particularly to systems and methods for recycling data in a solid state memory.

Various embodiments of the present invention provide data processing systems that include: a memory device, a data decoder circuit, and a recycle control circuit. The memory device is operable to maintain a data set, and the data decoder circuit is operable to apply one or more iterations of a data decoding algorithm to the data set accessed from the memory device to yield a decoded output, and to provide an iteration count indicating a number of iterations that the data decoding algorithm was applied to the data set. The recycle control circuit is operable to recycle a read data corresponding to the data set. The recycle is triggered based at least in part on the iteration count.

This summary provides only a general outline of some embodiments of the invention. The phrases "in one embodiment," "according to one embodiment," "various embodiments", "one or more embodiments", "particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
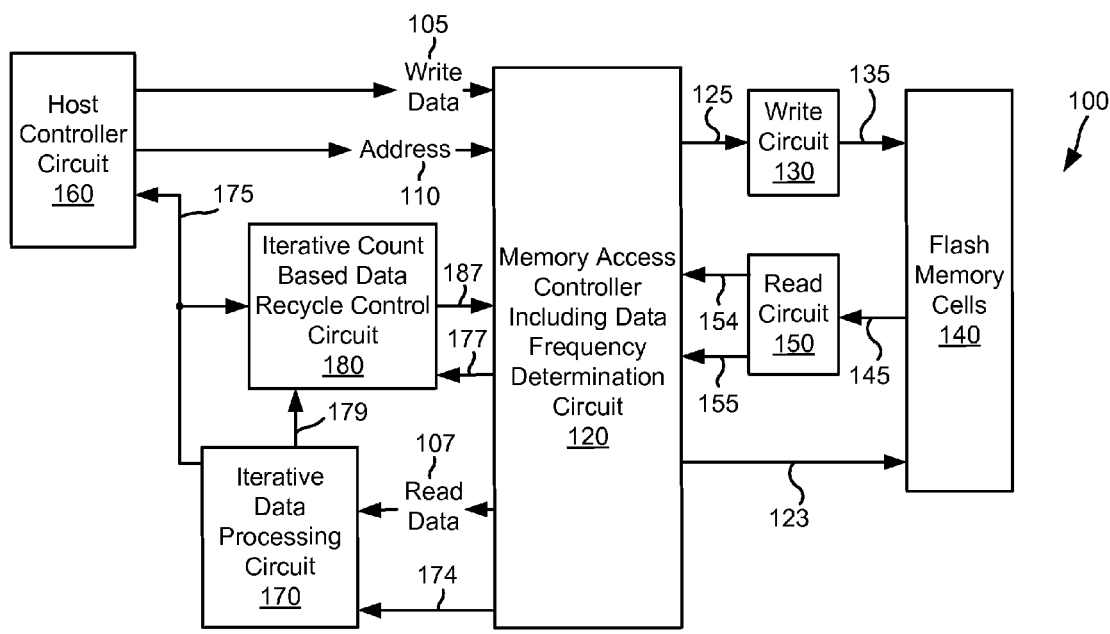
FIG. 1 shows a solid state storage device including an iterative count based data recycle control circuit in accordance with various embodiments of the present invention.

Systems and method relating generally to solid state memory, and more particularly to systems and methods for recycling data in a solid state memory.

Various embodiments of the present invention provide solid state memory systems that include an iterative data processing circuit. Where data accessed from a solid state memory includes one or more errors, the iterative data processing circuit applies one or more iterations of a data decoding algorithm in an attempt to correct any errors. The number of iterations required to correct the errors is provided to an iterative count based data recycle circuit. Iterative count based data recycle circuit determine whether to recycle the accessed data to increase the reliability of the accessed data and/or decrease the latency in future accesses of the data. In some embodiments of the present invention, the determination regarding recycling is made based upon a frequency at which the data is accessed in addition to the iterative count.

Various embodiments of the present invention provide data processing systems that include: a memory device, a data decoder circuit, and a recycle control circuit. The memory device is operable to maintain a data set, and the data decoder circuit is operable to apply one or more iterations of a data decoding algorithm to the data set accessed from the memory device to yield a decoded output, and to provide an iteration count indicating a number of iterations that the data decoding algorithm was applied to the data set. The recycle control circuit is operable to recycle a read data corresponding to the data set. The recycle is triggered based at least in part on the iteration count.

In some instances of the aforementioned embodiments, the data decoding algorithm is a low density parity check decoding algorithm. In various instances of the aforementioned embodiments, at least the data decoder circuit and the recycle control circuit are incorporated in an integrated circuit. In some such embodiments, the memory device is further incorporated in the integrated circuit. In some cases, the memory device is a flash memory device. In particular cases, the flash memory device is able to hold multiple bits of data in each memory cell of the flash memory device.

In various instances of the aforementioned embodiments, the recycle control circuit includes a comparator circuit operable to compare the iteration count with a threshold level. In some such instances, the threshold level is programmable. In other such instances, the threshold level is fixed.

In one or more instances of the aforementioned embodiments, the systems further include a memory access circuit. The memory access circuit operable to: access the data set from the memory device; and calculate a frequency of access corresponding to the data set. In some such instances, the recycle is triggered based at least in part on the iteration count and the frequency of access. In various cases, the recycle control circuit include a comparator circuit operable to compare the iteration count with one of a first threshold level or a second threshold level. The first threshold level is selected when the frequency of access exceeds a third threshold level, and the second threshold level is selected when the frequency of access is less than the third threshold level. In particular cases, one or more of the first threshold level, the second threshold level and/or the third threshold level is/are user programmable. In other cases, all of the first threshold level, the second threshold level and the third threshold level are fixed.

Other embodiments of the present invention provide methods for data recycling control in a memory device. The methods include: receiving a data set maintained in a memory device; applying at least one iteration of a data decoding algorithm to the data set by a data decoder circuit to yield a decoded output; counting the number of iterations of the data decoding algorithm applied to the data set to yield an iteration count; and recycling the data set to the memory device such that the recycling is triggered based at least in part on the iteration count. In some instances of the aforementioned embodiments, the data decoding algorithm is a low density parity check decoding algorithm.

In various instances of the aforementioned embodiments, recycling the data set is controlled by a recycle control circuit that includes a comparator circuit operable to compare the iteration count with a threshold level. In some instances of the aforementioned embodiments, the method further include determining a frequency of access corresponding to the data set. In some such instances, the recycle is triggered based at least in part on the iteration count and the frequency of access.

In one or more instances of the aforementioned embodiments, recycling the data set is controlled by a recycle control circuit that includes a comparator circuit operable to compare the iteration count with an iteration count threshold. In some such instances, the methods further include determining the iteration count threshold based at least in part on the frequency of access. In some cases, the iteration count threshold is selected from either a first threshold level or a second threshold level, either of which is programmable.

Turning to FIG. 1, a solid state storage device 100 including an iterative count based data recycle control circuit 180 in accordance with various embodiments of the present invention. Storage device 100 includes a host controller circuit 160 that directs read and write access to flash memory cells 140. Flash memory cells 140 may be NAND flash memory cells or another type of solid state memory cells as are known in the art.

A data write is effectuated when host controller circuit 160 provides write data 105 to be written along with an address 110 indicating the location to be written. A memory access controller 120 formats write data 105 and provides an address 123 and an encoded write data 125 to a write circuit 130. Write circuit 130 provides a write voltage 135 corresponding to respective groupings of encoded write data 125 that is used to charge respective flash memory cells addressed by address 123. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '11' | V3 |
| '10' | V2 |
| '00' | V1 |
| '01' | V0 |

Where V3 is greater than V2, V2 is greater than V1, and V1 is greater than V0.

A data read is effectuated when host controller circuit 160 provides address 110 along with a request to read data from the corresponding location in flash memory cells 140. Memory access controller 120 accesses a read voltage 145 from locations indicated by address 123 and compares the voltage to a number of threshold values to reduce the voltage to a multi-bit read data 155. Using the same two bit example, the following multi-bit read data 155 results:

| Voltage Input | Two Bit Data Output |
|---|---|
| >V2 | '11' |
| >V1 | '10' |
| >V0 | '00' |
| <=V0 | '01' |

This multi-bit read data 155 is provided from memory access controller 120 to iterative data processing circuit 170 as read data 107. Iterative data processing circuit 170 determines whether there are any errors in read data 107. Where there are no errors in read data 107, iterative data processing circuit 170 provides read data 107 as read data 175, and provides a zero value as an iterative count 179. It should be noted that the aforementioned table is merely an example, and that different devices may assign different bit values to the different voltage thresholds. For example in other cases the values in the following table may be used:

| Voltage Input | Two Bit Data Output |
|---|---|
| >V2 | '01' |
| >V1 | '00' |
| >V0 | '10' |
| <=V0 | '11' |

Of course, other bit patterns may be assigned to different thresholds.

Where errors remain, iterative data processing circuit 170 generates or accesses soft data corresponding to read data 107. Such soft data indicates a probability that given elements of read data 107 are correct. In some cases, this soft data is provided by read circuit 150 as soft data 154 and indicates a difference between read voltage 145 and a threshold value for the elements of read data 155. This soft information is provided to iterative data processing circuit 170 as soft data 174. In other embodiments of the present invention, the soft data is not available from read circuit 150. In such embodiments, the soft data may be generated. Such generation of soft data may be done using any approach known in the art for generating soft data. As one example, generation of soft data may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application is incorporated herein by reference for all purposes.

Iterative data processing circuit 170 repeatedly applies a data decoding algorithm to read data 107 and soft data 174 to yield a decoded output. As each iteration of the data decoding algorithm is applied, an iteration count is incremented. Where the decoded output converges (i.e., results in a correction of all remaining errors in read data 107), the decoded output is provided as read data 175, and the iteration count is provided as iterative count 179. Where the decoded output fails to converge (i.e., errors remain in the decoded output), another iteration of the data decoding algorithm is applied to read data 107 guided by the previous decoded output to yield an updated decoded output. This process continues until either all errors are corrected or a timeout condition occurs (e.g., 100 iterations). In some embodiments of the present invention, the data decoding algorithm is a low density parity check algorithm as is known in the art. Based upon the disclosure provided herein, one of ordinary skill in the art will recognize a variety of data decoding algorithms that may be used in relation to various embodiments of the present invention.

Iterative count based data recycle control circuit 180 determines whether to recycle read data 175. Such recycling includes re-writing read data 175 to a new location in flash memory cells 140 or re-writing data back to the same location in flash memory cells. This operates to refresh the data in flash memory cells 140 such that errors due to time decay or cell decay (together referred to as "data decay"). The determination of whether to recycle read data 175 is based upon iterative count 179. As a general rule, the value of iterative count 179 increases as data decay increases. Thus, where iterative count 179 exceeds a threshold value, iterative count based data recycle control circuit 180 causes read data 175 to be recycled by asserting a recycle enable 187 to memory access controller circuit 120. Such an approach to recycle control reduces the impact of data decay on data access latency and/or data loss.

In some embodiments of the present invention, recycle control is further applied to decrease access latency to frequently accessed data sets. In such a case, memory access controller circuit 120 maintains a table indicating the frequency at which data sets are accessed from flash memory cells 140. Information from the table is provided as a frequency indicator 177 to iterative count based data recycle control circuit 180. This information may be used to modify the threshold value to which iterative count 179 is compared. In particular, where frequency indicator exceeds a threshold level (i.e., indicating read data 175 is a frequently accessed data set), the threshold value to which iterative count 179 is compared is reduced. Thus, for frequently accessed data sets, the number of iterations allowed through iterative data processing circuit 170 is reduced. This decreases access latency for frequently accessed data sets, while allowing for greater access latency for less frequency accessed data sets. Such an approach to recycle control reduces the average access latency.

Figure 2:
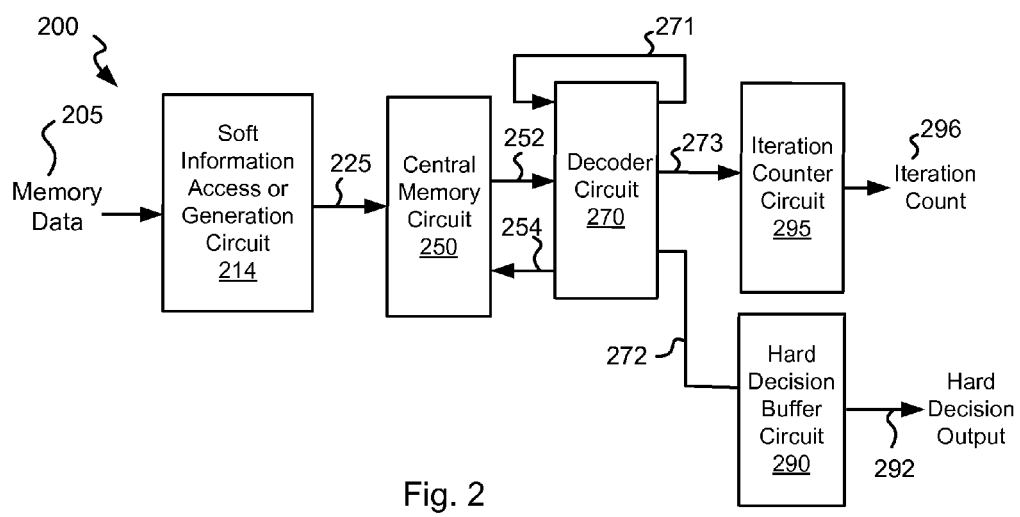
FIG. 2 depicts one implementation of an iterative data processing circuit that may be used in relation to embodiments of the present invention.

Turning to FIG. 2, one implementation of an iterative data processing circuit 200 is shown that may be used in relation to embodiments of the present invention. Where iterative data processing circuit 200 is used in place of iterative data processing circuit 170 of FIG. 1, read data 107 is connected to a memory data 205 input, iterative count 179 is connected to an iteration count 296, and read data 175 is connected to a hard decision output 292.

Iterative data processing circuit 200 receives memory data 205. A soft information access or generation circuit 214 is operable to either access soft information corresponding to memory data 205 or generate soft information corresponding to memory data 205. Such soft information indicates a probability that given elements of memory data 205 are correct. In some cases, this soft information is provided by a solid state memory device as an input (not shown) to soft information access generation circuit 214. In other cases, the soft information is generated. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Soft information access or generation circuit 214 provides a combination of soft information and memory data 205 to a central memory circuit 250 as a data set 225. Once a decoder circuit 270 is available, a previously stored data set 225 is accessed from central memory circuit 250 as a decoder input 252. In some embodiments of the present invention, the decoder circuit 270 is a low density parity check decoder circuit as is known in the art. Based upon the disclosure provided herein, one of ordinary skill in the art will recognize a variety of decoder circuits that may be used in relation to various embodiments of the present invention.

Decoder circuit 270 applies a data decoding algorithm to decoder input 252 to yield a decoded output 271. Each time the data decoding algorithm is applied, decoder circuit 270 asserts an iteration complete indicator 273 to an iteration counter circuit 295. Iteration counter circuit 295 counts each time iteration complete indicator 273 is asserted and provides iteration count 296 indicating the number of iterations through decoder circuit 270. Where decoded output 271 fails to converge (i.e., decoded output 271 includes errors), another iteration of the data decoding algorithm is applied to decoder input 252 guided by decoded output 271. This process is repeated until either decoded output 271 converges (i.e., is error free) or a timeout condition is met.

Alternatively, where decoded output 271 converges, it is provided as a decoded output 272 to a hard decision buffer circuit 290. Hard decision buffer circuit 290 provides the hard decisions of decoded output 272 as a hard decision output 292. At this juncture, iteration count 296 indicates the total number of iterations through decoder circuit 270 that were used to correct errors in memory data 205.

Figure 3A:
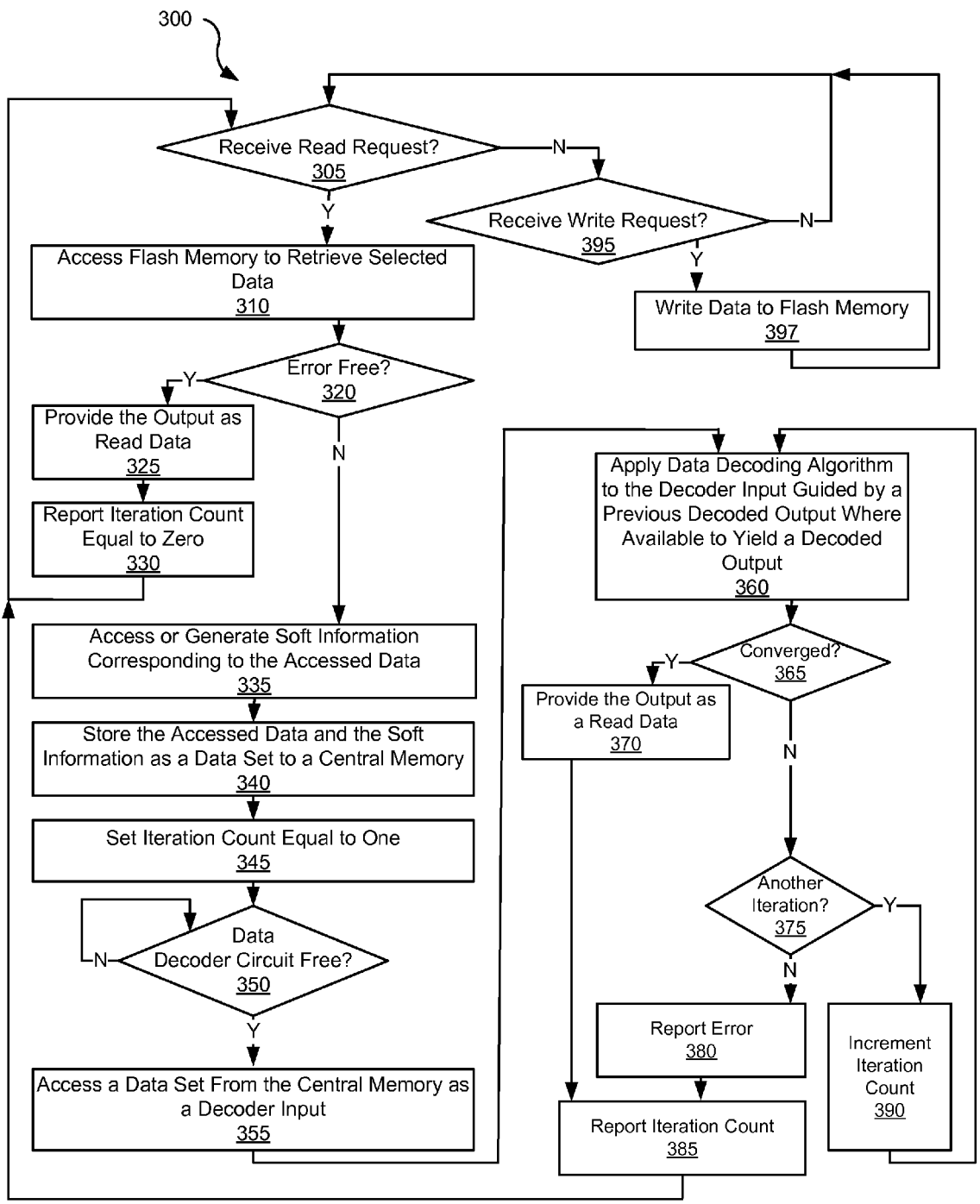
FIGS. 3$a$-3$c$ are flow diagrams showing a method for iteration count based data recycling in accordance with some embodiments of the present invention.
Figure 3B:
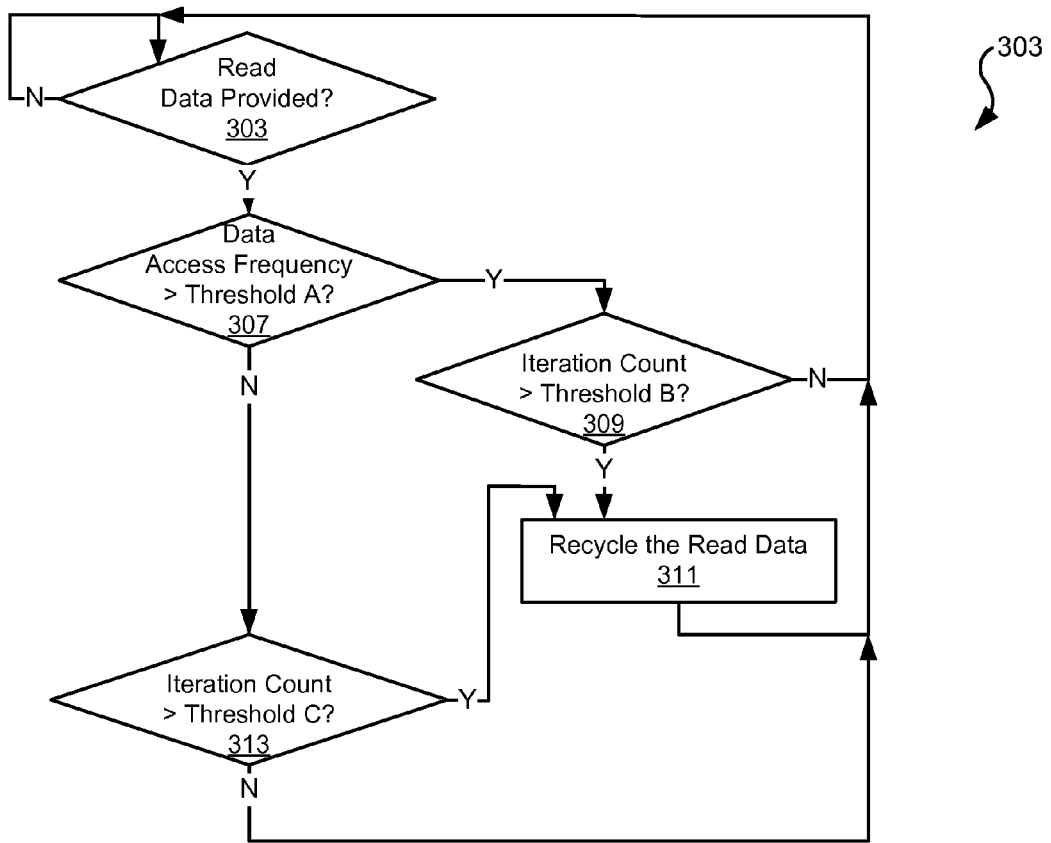

Turning to FIGS. 3a-3b, flow diagrams 300, 301 showing a method for iteration count based data recycling in accordance with some embodiments of the present invention. Following flow diagram 300 of FIG. 3a, it is determined whether a read request is received (block 305). Where a read request is not received (block 305), it is determined whether a write request has been received (block 395). Where a write request is received (block 395), data received is formatted and written to a location in the flash memory indicated by an address received as part of the write request (block 397), and the process returns to block 305.

Alternatively, when a read access is received, it includes an address indicating a location from which the data is to be accessed. Data is then accessed from the flash memory at the location indicated by the read request (block 310). It is determined whether the retrieved data is error free (block 320). Where it is determined that the data is error free (block 320), the retrieved data is provided as read data (block 325) and an iteration count is equal to zero (block 330). The process then returns to block 305. As discussed below in relation to FIG. 3b-3c, flow diagrams 301, 302 disclose alternative parallel processes triggered anytime read data is provided.

Otherwise, where it is not determined that the data is error free (block 320), soft information corresponding to the accessed data is either accessed or generated (block 335). Such soft information indicates a probability that given elements of the accessed data are correct. In some cases, this soft information is provided by a solid state memory device from which the data was accessed. In other cases, the soft information is generated. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

The accessed data and the corresponding soft information is stored as a data set to a central memory (block 340), and the iteration count is incremented to a value of one (block 345). It is then determined whether the data decoder circuit is available for processing (block 350). Where the data decoder circuit is available for processing (block 350), a previously stored data set is accessed from the central memory as a decoder input (block 355). A data decoding algorithm is applied to the accessed data set to yield a decoded output (block 360). Where available (i.e., for the second and later iterations), a previous decoded output is used to guide application of the data decoding algorithm. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention.

It is determined whether the decoded output converged (block 365). Where it is determined that the decoded output converged (block 365), the decoded output is provided as read data (block 370) and the current iteration count is reported as the iteration count (block 385). The process then returns to block 305. Again, as discussed below in relation to FIG. 3b-3c, flow diagrams 301, 302 disclose alternative parallel processes triggered anytime read data is provided.

Alternatively, where it is determined that the decoded output failed to converge (block 365). It is determined whether another iteration of the data decoding algorithm is allowed (block 375). In some cases, a maximum number of iterations of the data decoding algorithm is fixed or programmable. This is effectively a timeout condition. In some cases, the maximum number of allowable iterations of the data decoding algorithm is one hundred. Based upon the disclosure provided herein, one of ordinary skill in the art will recognize other numbers of iterations that may be allowed in relation to different embodiments of the present invention. Where another local iteration is not allowed (block 375), an error is indicated (block 380) and the current iteration count is reported as the iteration count (block 385). The process then returns to block 305. Otherwise, where another iteration of the decoding algorithm is allowed (block 375), the iteration count is incremented (block 390) and the processes of blocks 360-375 are repeated.

Turning to FIG. 3b, a flow diagram 301 shows a method in accordance with some embodiments of the present invention for determining a data recycle. Following flow diagram 301, it is determined whether read data has been provided (block 303). As discussed above, read data is provided as part of blocks 325, 370 of flow diagram 300. Where read data has been provided (block 303), it is determined whether the access frequency of the read data exceeds a threshold A (block 307). The access frequency is an indication of how many time the particular data provided as read data has been accessed from the flash memory. The access frequency may be determined over a defined period such as, for example, a one day period. Based upon the disclosure provided herein, one of ordinary skill in the art will recognize a variety of periods over which an access frequency may be calculated, and/or a variety of methods for calculating the access frequency. In some embodiments of the present invention, the threshold A is a fixed value. In other embodiments of the present invention, the threshold A is a user programmable value.

Where the access frequency exceeds threshold A (block 307), it is determined whether the iteration count corresponding to the provided read data exceeds a threshold B (block 309). Where the threshold B is not exceeded (block 309), no data recycle is instigated and the process returns to block 303. Alternatively, where the threshold B is exceeded (block 309), the provided read data is recycled (block 311). The process then returns to block 303. Such recycling includes re-writing the provided read data to a new location in the flash memory or to the same location in the flash memory. This operates to refresh the data in the flash memory such that data decay is not allowed to increase the number of iterations of the data decoding algorithm required to correct the errors in the data. Such an approach to recycle control reduces the impact of data decay on data access latency and/or data loss. In some embodiments of the present invention, the threshold B is a fixed value. In other embodiments of the present invention, the threshold B is a user programmable value.

Alternatively, where the access frequency is not greater than the threshold A (block 307), it is determined whether the iteration count is greater than a threshold C (block 313). Where the iteration count is greater than the threshold C (block 313), the provided read data is recycled (block 311). The process then returns to block 303. Otherwise, where the iteration count is not greater than the threshold C (block 313), no data recycle is instigated and the process returns to block 303. In some embodiments of the present invention, the threshold C is a fixed value. In other embodiments of the present invention, the threshold C is a user programmable value.

Figure 3C:
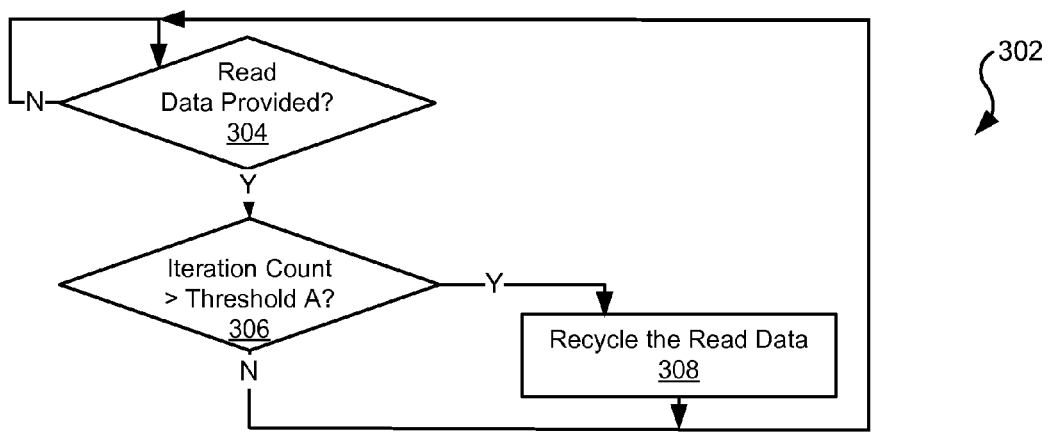

Turning to FIG. 3c, a flow diagram 302 shows another method in accordance with some embodiments of the present invention for determining a data recycle. Following flow diagram 302, it is determined whether read data has been provided (block 304). As discussed above, read data is provided as part of blocks 325, 370 of flow diagram 300. Where read data has been provided (block 304), it is determined whether the iteration count is greater than a threshold A (block 306). Where the iteration count is greater than the threshold A (block 306), the provided read data is recycled (block 308). The process then returns to block 304. Such recycling includes re-writing the provided read data to a new location in the flash memory or to the same location in the flash memory. This operates to refresh the data in the flash memory such that data decay is not allowed to increase the number of iterations of the data decoding algorithm required to correct the errors in the data. Such an approach to recycle control reduces the impact of data decay on data access latency and/or data loss. In some embodiments of the present invention, the threshold A is a fixed value. In other embodiments of the present invention, the threshold A is a user programmable value. Alternatively, where the iteration count is not greater than the threshold A (block 306), no data recycle is instigated and the process returns to block 304

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   a memory device operable to maintain a data set;
   a data decoder circuit operable to apply one or more iterations of a data decoding algorithm to the data set accessed from the memory device to yield a decoded output, and to provide an iteration count indicating a number of iterations that the data decoding algorithm was applied to the data set;
   a memory access circuit operable to calculate a frequency of access corresponding to the data set; and
   a recycle control circuit including a comparator circuit operable to compare the frequency of access with an access frequency threshold, and the recycle control circuit modifies an iteration threshold upon determining the frequency of access exceeds the access frequency threshold;
   wherein the comparator circuit is operable to compare the iteration count to the modified iteration threshold; and
   wherein the recycle control circuit recycles read data corresponding to the data set upon determining the iteration count exceeds the modified iteration threshold.

2. The data processing system of claim 1, wherein the data decoding algorithm is a low density parity check decoding algorithm.

3. The data processing system of claim 1, wherein the system further comprises:
   the memory access circuit operable to access the data set from the memory device;
   wherein the recycle is triggered based at least in part on the iteration count and the frequency of access.

4. The data processing system of claim 1, wherein at least one of the iteration threshold, the modified iteration threshold and the access frequency threshold is user programmable.

5. The data processing system of claim 1, wherein at least the data decoder circuit and the recycle control circuit are incorporated in an integrated circuit.

6. The data processing system of claim 1, wherein the data processing system is implemented on an integrated circuit.

7. The data processing system of claim 1, wherein the memory device is a flash memory device.

8. The data processing system of claim 7, wherein the flash memory device is able to hold multiple bits of data in each memory cell of the flash memory device.

9. A method for data recycling control in a memory device, the method comprising:
   receiving a data set maintained in a memory device;
   applying at least one iteration of a data decoding algorithm to the data set by a data decoder circuit to yield a decoded output;
   counting the number of iterations of the data decoding algorithm applied to the data set to yield an iteration count;
   calculating a frequency of access corresponding to the data set;
   modifying an iteration threshold upon determining the frequency of access exceeds an access frequency threshold;
   comparing the iteration count with the modified iteration threshold; and
   recycling read data corresponding to the data set upon determining the iteration count exceeds the modified iteration threshold.

10. The method of claim 9, wherein the data decoding algorithm is a low density parity check decoding algorithm.

11. The method of claim 9,
    wherein the recycle is triggered based at least in part on the iteration count and the frequency of access.

12. The method of claim 9, wherein the method further comprises:
    programming at least one of the iteration threshold, the modified iteration threshold, and the access frequency threshold.

13. A data storage device, the data storage device comprising:
    a flash memory device operable to maintain a data set;
    a memory access circuit operable to:
      access the data set from the memory device; and
      calculate a frequency of access corresponding to the data set;
    a data decoder circuit operable to apply one or more iterations of a data decoding algorithm to the data set accessed from the memory device to yield a decoded output, and to provide an iteration count indicating a number of iterations that the data decoding algorithm was applied to the data set;
    a recycle control circuit including a comparator circuit operable to compare the frequency of access with an access frequency threshold, the recycle control circuit modifies an iteration threshold upon determining the frequency of access exceeds the access frequency threshold;
    wherein the comparator circuit is operable to compare the iteration count to the modified iteration threshold; and
    wherein the recycle control circuit recycles read data corresponding to the data set upon determining the iteration count exceeds the modified iteration threshold.

* * * * *